United States Patent
Bass et al.

(10) Patent No.: US 7,471,706 B2
(45) Date of Patent: Dec. 30, 2008

(54) HIGH RESOLUTION, FULL COLOR, HIGH BRIGHTNESS FULLY INTEGRATED LIGHT EMITTING DEVICES AND DISPLAYS

(75) Inventors: Michael Bass, Orlando, FL (US); Dennis G. Deppe, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 0 days.

(21) Appl. No.: 11/758,435

(22) Filed: Jun. 5, 2007

(65) Prior Publication Data

US 2007/0297750 A1 Dec. 27, 2007

Related U.S. Application Data

(60) Provisional application No. 60/811,969, filed on Jun. 7, 2006.

(51) Int. Cl.
*H01S 3/00* (2006.01)
*H01S 3/10* (2006.01)
*H01S 5/00* (2006.01)

(52) U.S. Cl. .............. 372/21; 372/1; 372/22; 372/50.121

(58) Field of Classification Search .......... 372/1, 372/21, 22, 50.121
See application file for complete search history.

(56) References Cited

U.S. PATENT DOCUMENTS

| | | | |
|---|---|---|---|
| 5,184,114 A | 2/1993 | Brown | |
| 5,334,991 A * | 8/1994 | Wells et al. | 345/8 |
| 5,436,919 A * | 7/1995 | Chwalek et al. | 372/7 |
| 5,684,621 A | 11/1997 | Downing | |
| 5,764,403 A | 6/1998 | Downing | |
| 5,914,807 A | 6/1999 | Downing | |
| 5,943,160 A | 8/1999 | Downing | |
| 5,956,172 A | 9/1999 | Downing | |
| 6,028,977 A | 2/2000 | Newsome | |
| 6,208,791 B1 | 3/2001 | Bischel et al. | |
| 6,215,462 B1 | 4/2001 | Yamada et al. | |
| 6,327,074 B1 * | 12/2001 | Bass et al. | 359/326 |
| 6,654,161 B2 | 11/2003 | Bass et al. | |
| 6,795,455 B2 | 9/2004 | Scheps | |
| 2002/0167981 A1 * | 11/2002 | Eisenbeiser | 372/43 |
| 2007/0019691 A1 * | 1/2007 | Monch et al. | 372/22 |

* cited by examiner

*Primary Examiner*—Armando Rodriguez
(74) *Attorney, Agent, or Firm*—Darby & Darby PC

(57) ABSTRACT

A light emitting device includes a substrate, at least one semiconductor light emitting device formed in or on the substrate, and upconverting material disposed in or on the substrate. The upconverting material is disposed in a path of light processed or emitted by the semiconductor device. The upconverting material absorbs light emitted by the semiconductor device and emits upconverted light in response. Integrated pixelated displays include a plurality of pixels formed on a surface of the substrate, with each pixel including up-conversion material based red light source, a blue light source a green light source, and a structure for selectively controlling emission from the red, blue and green lights sources for each of the pixels.

16 Claims, 7 Drawing Sheets

400

HIGH RESOLUTION, FULL COLOR, HIGH BRIGHTNESS FULLY INTEGRATED LIGHT EMITTING DEVICES AND DISPLAYS

CROSS-REFERENCE TO RELATED APPLICATIONS

The present application incorporates by reference in its entirety and claims the benefit of U.S. Provisional Application Ser. No. 60/811,969 entitled "HIGH RESOLUTION, FULL COLOR, HIGH BRIGHTNESS FULLY INTEGRATED LIGHT EMITTING DEVICES AND DISPLAYS" filed on Jun. 7, 2006.

STATEMENT REGARDING FEDERALLY SPONSORED RESEARCH OR DEVELOPMENT

Not applicable

FIELD OF THE INVENTION

The invention is related to light emitting devices and pixelated displays based on the combination of upconverting materials and semiconductor light emitting devices.

BACKGROUND OF THE INVENTION

Several patents disclose panel displays using two-frequency upconversion fluorescence, such as U.S. Pat. Nos. 5,684,621; 5,764,403; 5,914,807; 5,943,160, and 5,956,172 all to Downing. Upconversion is generally the addition of two or more photons of light by a material. The upconversion material then emits one photon in response. A requirement for an upconversion material is that the emitted photon has a higher energy (shorter wavelength) than either of the excitation photons. For most applications, excitation photons are near infrared, with the emitted photons being in the visible range of the spectrum.

Although near infrared diodes are relatively simple and inexpensive, the light is not visible to an observer. Red, green and blue visible light laser sources are complex and expensive and produce light that an observer sees as speckled. Therefore, some display systems have been developed that employ the simplicity of the diode laser and yet yields full color, high resolution, high brightness, speckle free images.

For example, U.S. Pat. No. 6,327,074 B1 to Bass et al (Bass '704) is entitled "Display medium using emitting particles dispersed in a transparent host". Bass '704 discloses two and three dimensional color image displays. The displays include a display medium comprising a plurality of pixels. Each pixel has a substantially uniform dispersion of red, green and blue visible light emitting particles therein sized between approximately 0.5 to approximately 50 microns. The particles disclosed include dye doped polymethylmethacrylate (pmma) plastic, and the display medium disclosed includes pmma, acrylic plastic or glass. Other particles can be used such as rare earth doped crystals. The two dimensional display disclosed uses three (3) remotely positioned laser sources each providing different emission wavelengths that are directed to each the respective pixels of the display medium using a scanning device. Light is absorbed by the particles which then become excited and emit visible fluorescence. The disclosed scanners and lenses move and focus the laser beams to different pixels in order to form the images having different visible colors.

Although Bass '704 is a significant advance in display technology, the plurality of separate system components, such as lasers, modulators, scanners and focus optics required results in a system size, complexity and cost which limits its use in certain applications. What is needed is a fully integrated upconversion material-based high resolution display. Such a display would provide mass production, small size and associated low cost, as well as being robust and highly reliability.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A light emitting device comprises a substrate, at least one semiconductor light emitting device formed in or on the substrate, and upconverting material disposed in or on the substrate. The upconverting material is disposed in a path of light processed or emitted by the semiconductor device. The upconverting material absorbs light emitted by the semiconductor device and emits upconverted light in response. The term "light" as used herein corresponds wavelengths both within the visible light range and outside the visible light range, such as infrared and near infrared light.

The upconverting material can be disposed within an active portion of the semiconductor device or on an emitting surface of the semiconductor device. In one embodiment, the semiconductor device is a surface emitting device, such as a Vertical-Cavity Surface-Emitting Laser (VCSEL) or a resonant cavity light emitting diode (RCLED). In another embodiment, the semiconductor device is an edge emitting device, such as an edge emitting laser. The upconverting material can comprise a plurality of particles having an average size from 0.1 microns to 100 microns. In one arrangement, the at least one semiconductor device comprises a plurality of said semiconductor devices formed in or on said substrate and said upconverting material comprises a plurality of regions of said upconverting material, some of the semiconductor devices being optically coupled to red upconverting material, some of the semiconductor devices have associated green upconverting material, and some of the semiconductor devices have associated blue upconverting material. The substrate can comprise a variety of integrated circuit compatible substrates, such as silicon or GaAs.

An integrated pixelated display comprises a substrate, a plurality of pixels formed on a surface of the substrate. The pixels each comprise a red light source comprising at least one first semiconductor light emitting device formed using the substrate, and red upconverting material disposed in or on the substrate, wherein the red upconverting material is in a path of light processed or emitted by the first semiconductor device, the upconverting material absorbing light from the first semiconductor device and emitting red light in response. A blue light source comprises at least one second semiconductor light emitting device formed using the substrate, and blue upconverting material disposed in or on the substrate, wherein the blue upconverting material is in a path of light processed or emitted by the second semiconductor device, the blue upconverting material absorbing light from said second semiconductor device and emitting blue light in response. A green light source comprises at least one third semiconductor light emitting device formed using the substrate, the green upconverting material being disposed in or on the substrate, wherein the green upconverting material is in a path of light processed or emitted by the third semiconductor device, the green upconverting material absorbing light from the third semiconductor device and emitting green light in response. The display includes a structure for selectively controlling emission from the plurality of light sources for each of the plurality of pixels. In one embodiment, the first, second and third semiconductor light emitting devices comprise VCSELs or RCLEDs. In one arrangement, the first, second and third semiconductor light emitting devices emit different wavelengths.

A head mounted display (HMD) apparatus comprises at least one integrated pixelated display according to the invention and a first and a second magnifying lens optically aligned to receive light emitted from the plurality of pixels. In one arrangement, the integrated pixelated display comprises a first and a second integrated pixelated display, the first and second integrated pixelated display being optically coupled to the first and a second magnifying lens, respectively.

BRIEF DESCRIPTION OF THE DRAWINGS

There is shown in the drawings embodiments which are presently preferred, it being understood, however, that the invention can be embodied in other forms without departing from the spirit or essential attributes thereof FIG. 1(c) shows an embodiment of the present invention comprising a VCSEL having an active region comprising upconverting material in the active region having quantum wells, while

DETAILED DESCRIPTION

Figure 1A:
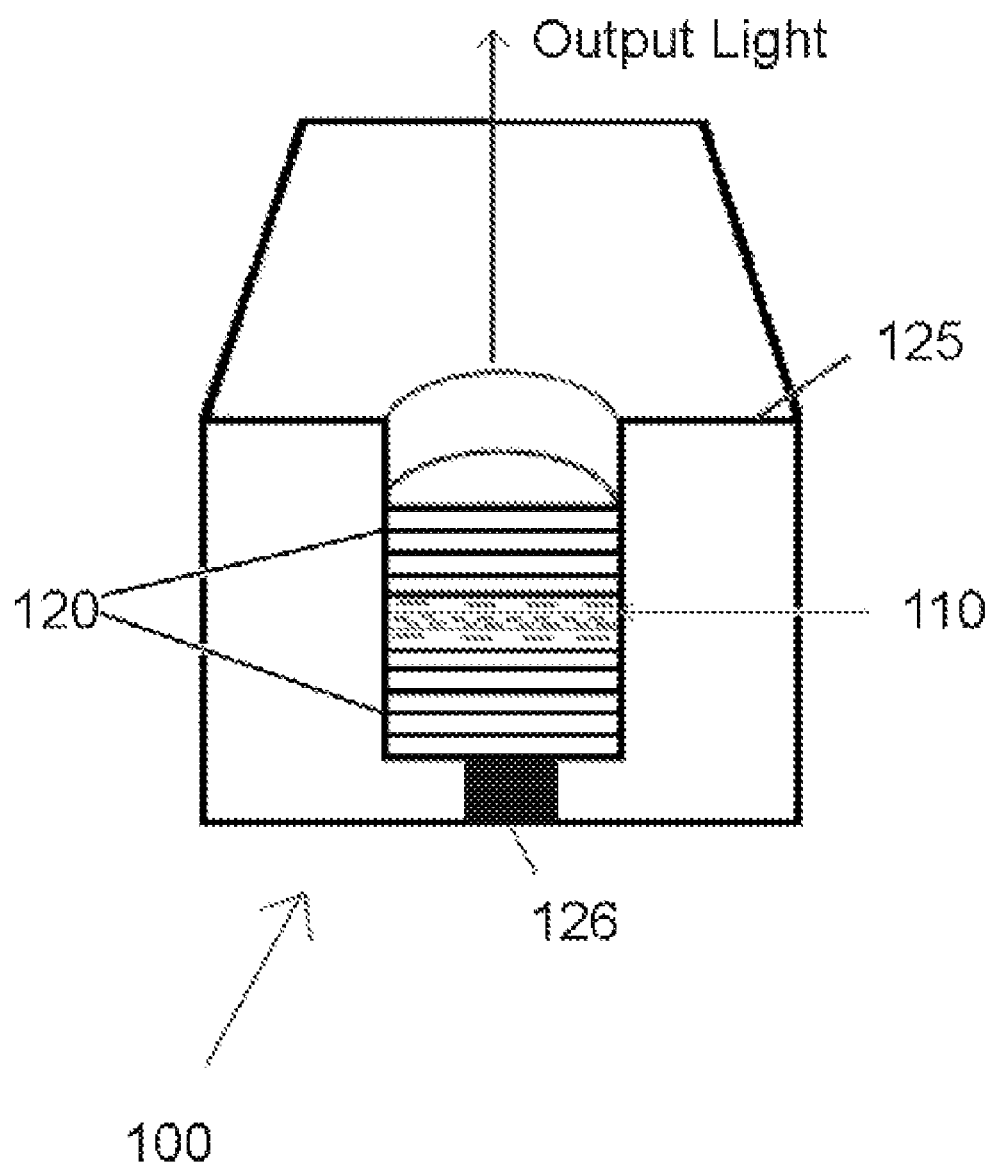
FIG. 1(a) shows a simplified cross sectional view of a conventional VCSEL.

A light generator comprises a substrate, wherein at least one semiconductor light emitting device is formed in or on the substrate. Upconverting material is disposed in or on the substrate, wherein the upconverting material is in a path of light processed or emitted by the semiconductor device. The upconverting material is defined herein as a material that absorbs light from the semiconductor device and emits upconverted (higher energy) light in response. The light emitting device generally emits infrared light, such as near infrared light, while the upconverting material generally emits visible light. However, the invention is not limited to this particular arrangement.

The substrate is preferably an integrated circuit substrate, such as a silicon or GaAs. The substrate can also be a laser epi substrate. Light generators according to the invention can thus be fabricated economically using conventional integrated circuit processing, such as diffusions, ion implants, lithography including uv lithography, depositions, and various etch and thin film removal processes. Individual devices or arrays of such devices can be formed on the same substrate using the invention.

The active region of the semiconductor light source can be formed from semiconductor bulk, planar quantum well, quantum wire, quantum dot active material, or other active medium. The light emitting device preferably comprises a laser or a light emitting diode (LED) source. Lasers include diode based lasers including conventional diode lasers and vertical cavity surface emitting lasers (VCSEL). A diode laser, also referred to as a laser diode, includes a resonant high Q cavity. With sufficient feedback, laser action results. Most laser diodes have the cavity built right into the device but in some arrangements an external cavity can be used. The high Q cavity of the diode laser cuts down drastically the number of modes operating. The result is that the emission line narrows drastically (more monochromatic) and the beam narrows somewhat spatially as compared to an LED.

LEDs can include conventional LEDS, organic LED ("OLED") and flexible OLEDs ("FOLED"). An LED emits photons from recombining electrons in the junction region. In the absence of their own cavity, LEDs generally have a very broad spectrum, but advantageously do not require control electronics. A resonant cavity LED (RCLED) can produce a reduced spectral width, and enhanced emission into preferred optical modes. A RCLED can be made to emit efficiently from a semiconductor surface with both a cavity controlled spectral width and a cavity controlled radiation pattern.

When applied to arrays, surface emitting devices are generally preferred. However, semiconductor light emitting arrays can also be made from edge-emitting devices by forming linear arrays of emitting elements on a substrate. In addition, linear arrays can be combined in stacks of arrays to make two-dimensional arrays of semiconductor light emitters with increased emitting area and power. Known epitaxial growth techniques based on stacked active regions interconnected by tunnel injection junctions can also be used to form two-dimensional arrays of semiconductor light emitters that emit from their edge. In the case of edge-emitting devices, the upconverting particles can be deposited on the emitting edge by thin film deposition. Additional techniques such as ink jet printing of the upconverting particles in solution can also be used. In the case of ink jet printing, the up-converting particles are generally applied together with an optically transparent binder material.

The light emission excited from an edge emitting device uses emission from the upconverting film/particles placed on the emitting edge. The advantage of the edge-emitting devices is lower cost in fabrication, possibly higher power density, and possibly higher overall power. Edge emitting devices may be particularly useful, for example, in a flashlight based on the films on edge emitters.

The upconverting material is preferably provided in the form of particles. Particles generally have sizes between approximately 0.5 microns to approximately 100 microns and can be formed by grinding or milling as described in U.S. Pat. No. 6,654,161 to Bass et al. Upconverting materials can be based on materials '161 to Bass as well as Bass '074 disclosed above in the background. Bass '161 and Bass '074 are incorporated by reference in their entirety into the present application. For example, the particles can be simply placed on the emitting surface, held in an organic or inorganic thin film disposed on the emitting surface, or formed within a composite resonant cavity. When disposed in the resonant cavity, the upconverting material is generally in the form of discrete molecules, or small clusters of molecules.

One method of forming upconverting particle(s) in a resonant cavity deposited on the surface of the semiconductor is to grow, deposit or form a first mirror on the semiconductor. The mirror is optically coupled to light emitted from the semiconductor light source. The mirror directs light from the light source to optically interacts with a region in which upconverting material will be formed. Deposition of the upconverting material then occurs, then followed by deposition or growth of a second mirror that also optically interacts with the upconverting material thus forming a resonant cavity having the upconverting material. In this way the upconverting material is placed in its own cavity, or in a composite cavity that interacts both with the semiconductor light source and upconverting material. Such cavities can have multiple optical resonances through choice of mirror material combinations, and these multiple optical resonances can influence both the semiconductor light emission and the light emission from the upconverting material. These multiple optical resonances may also be designed to increase the absorption efficiency of the semiconductor light by the upconverting material.

The upconverting materials can be selected from materials which emit red, green, and blue visible light by two (or more) photon absorption excitation. For display applications the respective up converter material (red, green and blue emitting) are spatially separated from one another and are generally excited by their own light sources. Each display pixel thus generally has three associated semiconductor light emitting devices, with one light emitting device coupled to the red upconverting material, one light emitting device coupled to the green upconverting material and one blue light emitting device coupled to the blue upconverting material. When more than one emitter in a pixel is excited, a human observer will see a color other than red green or blue, but rather a color that lies within the color gamut defined by the combination of wavelengths emitted. A pixel thus can generate any color by emitting the desired mixture of red green and/or blue so long as that color lies within the color gamut.

Combinations of color emitters to generate white light sources, or single color sources are also possible. For such applications the emitters can be combined in layered or mixed combinations to be jointly excited by a single semiconductor light source. These combinations can be useful for illumination using the white light source, or for signaling or other applications using individual colors or combined colors of fixed spectral content.

Separate emitters can be independently accessed and made to emit independently using well known addressing techniques. Independent emission of the red, green, and blue light emitters can be used to fabricate a full color display.

For example, as disclosed in Bass '161, $Yb^{3+}$ ions absorb light from a diode laser emitting near 975 nm and transfer that energy to the other dopant ions. Using a fluoride crystal host, $NaYF_4$, co-doped with $Tm^{3+}$ ions provides blue light at about 480 nm, with $Ho^{3+}$ or $Er^{3+}$ ions green light at about 550 nm is obtained and with $Er^{3+}$ red light at about 650 nm is obtained. As a result, any color in the very large range of colors (the color gamut) defined by the red, green and blue light, or combinations thereof, can be emitted from each pixel. The semiconductor light sources need not provide the same emission. For example, the semiconductor light sources may be configured to emit different near infrared wavelengths to maximize the performance of the selected red, green and blue emitters.

In yet another embodiment, pixels contain only one specific color emitting particle type, such as red, green or blue. In this embodiment, the semiconductor light source is selected to excite the particular color emitting particles located on that pixel.

Although generally described above as being particles disposed on the pixel surface (e.g. emitting surface of the semiconductor emitting device), more generally the upconversion is provided by upconverting material, which is not necessarily in the form of particles. A significant advantage is obtained when the upconverter material is disposed within the resonant cavity or within a second resonant cavity since such cavities provide spectral selection and increase the efficiency through enhanced near infrared and visible intensity.

FIG. 1(a) shows a simplified cross sectional view of a conventional VCSEL. VCSEL 100 has an active region 110 with bulk or one or more quantum well layers. On opposite sides of the active region are mirror stacks which are typically formed by interleaved semiconductor layers having alternating high and low refractive index properties, where each layer is typically a quarter wavelength thick at the wavelength (in the medium) of interest thereby forming the mirrors (Bragg reflectors 120) for the laser cavity. There are opposite conductivity type (p and n-type) regions on opposite sides of the active region 110, and the laser is typically turned on and off by varying the current through the active region applied via positive metal contact 125 and negative metal contact 126. When on, laser 100 emits light perpendicular to its top surface as shown.

High-yield, high performance VCSELs have been exploited in commercialization for several years. For example, top-surface-emitting AlGaAs-based VCSELs are producible in a manner analogous to semiconductor integrated circuits, and are suitable for low-cost high-volume manufacture and integration with existing electronics technology platforms. Moreover, VCSEL uniformity and reproducibility have been demonstrated using a standard, unmodified commercially available metal organic vapor phase epitaxy (MOVPE) chamber and molecular beam epitaxy (MBE) giving very high device yields.

Figure 1B:
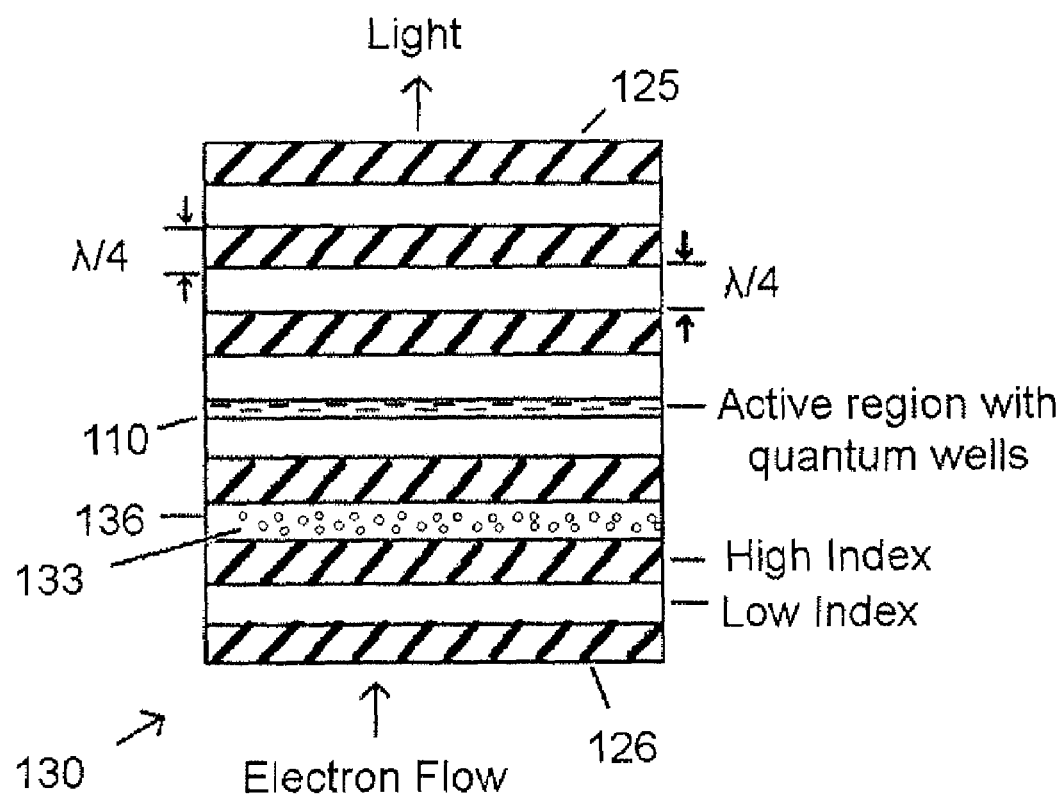
FIG. 1(b) shows an embodiment of the present invention comprising a VCSEL having upconverting material within a low index layer which is part of the resonant cavity of the VCSEL.
Figure 1C:
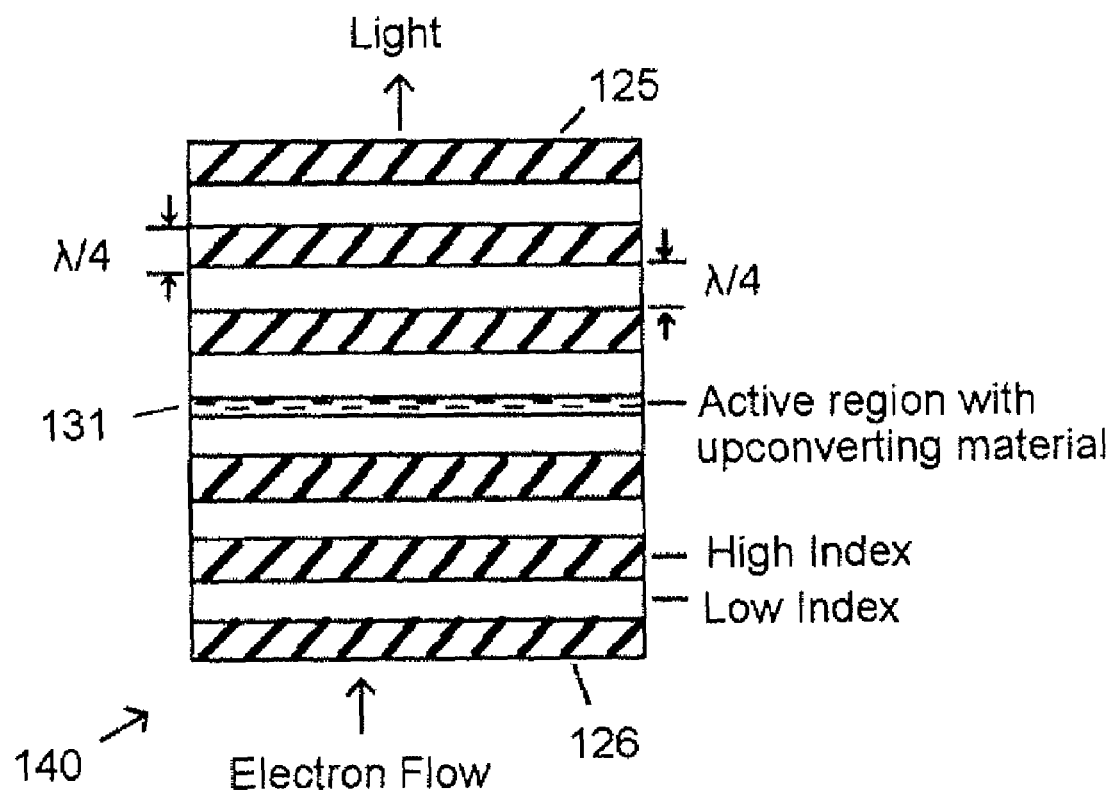
Figure 1D:
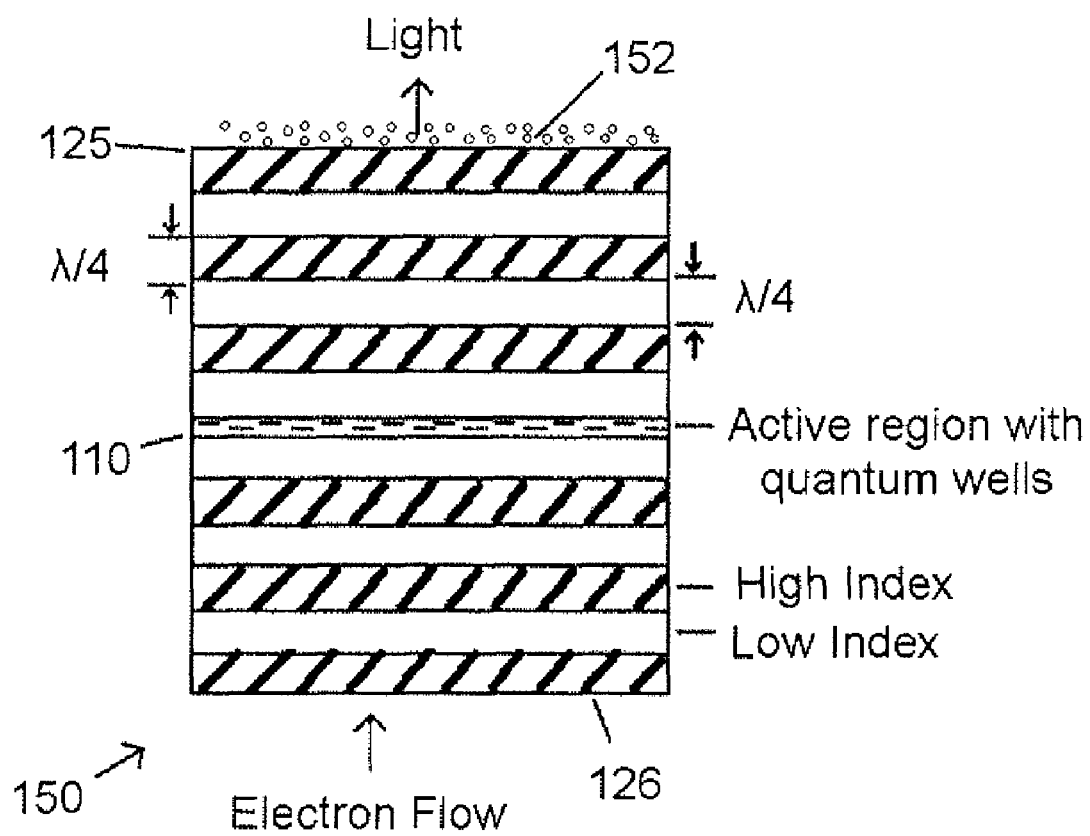
FIG. 1(d) shows an embodiment of the present invention comprising a VCSEL having upconverting material disposed on a topside emitting surface.

In one embodiment of the present invention, the upconverting material is disposed in an active portion of the light emitting device. FIG. 1(b) shows VCSEL 130 having upconverting material 133 within low index layer 136 which is part of the resonant cavity of the VCSEL. FIG. 1(c) shows VCSEL 140 having an active region 131 comprising upconverting material in the active region with quantum wells. FIG. 1(d) shows VCSEL 150 having upconverting material 152 disposed on a light emitting surface of the VCSEL. The upconverting material shown can be intermixed with an optically transparent organic or inorganic binder material, such as could be applied by known ink jet printing techniques.

Figure 2:
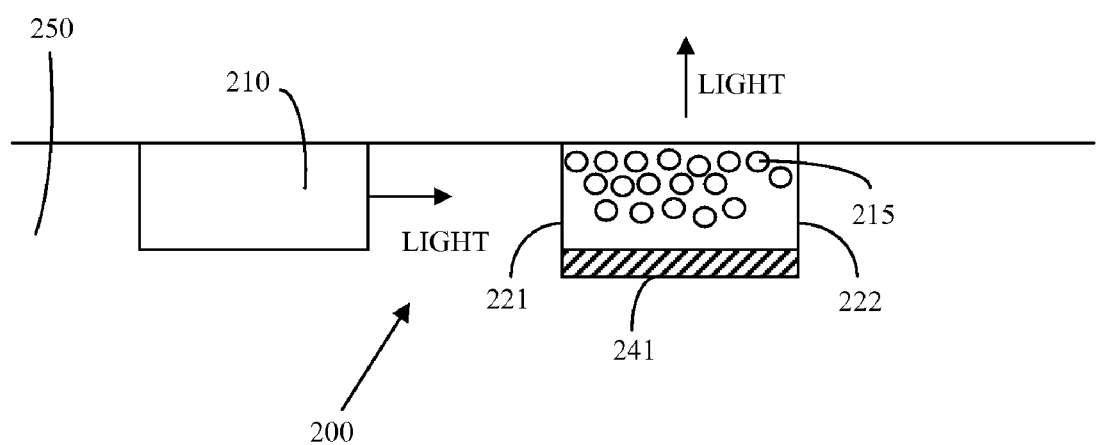
FIG. 2 shows an integrated light emitting semiconductor device according to an embodiment of the invention comprising a light emitting source optically coupled to a resonant cavity formed in the substrate spaced laterally from the light emitting device, wherein the resonant cavity includes upconversion material therein.

In yet another embodiment, the upconverting material is in optical communication with light emanating from the light emitting surface. For example, the upconversion material can be in a resonant cavity formed in the substrate spaced apart from the light emitting device. FIG. 2 shows an integrated light emitting semiconductor device 200 according to an embodiment of the invention comprising a light emitting source 210, such as an edge emitting laser, optically coupled to a resonant cavity formed in the substrate 250 spaced apart from the light emitting source 210, wherein the resonant cavity includes upconversion material 215 therein. The resonant cavity comprises first mirror 221 and second mirror 222. First mirror 221 is partially transmissive to light emitted by light emitting source 210. Highly reflecting back surface 241 is preferably provided.

Arrays of semiconductor light sources with appropriate upconverters according to the present invention can be used to fabricate high resolution displays having hundreds or many thousands of pixels. In some embodiments the semiconductor light sources are RCLEDs. To form full color displays, pixels containing one red, one green and one blue emitting combination of upconverting particles and semiconductor light sources are provided. Monochromatic displays of any color are also possible by selecting any one of the primary (RGB) upconverters or by combining them to achieve another desired color. White light can be generated by selecting appropriate combinations of two or three or more emitters.

Figure 3:
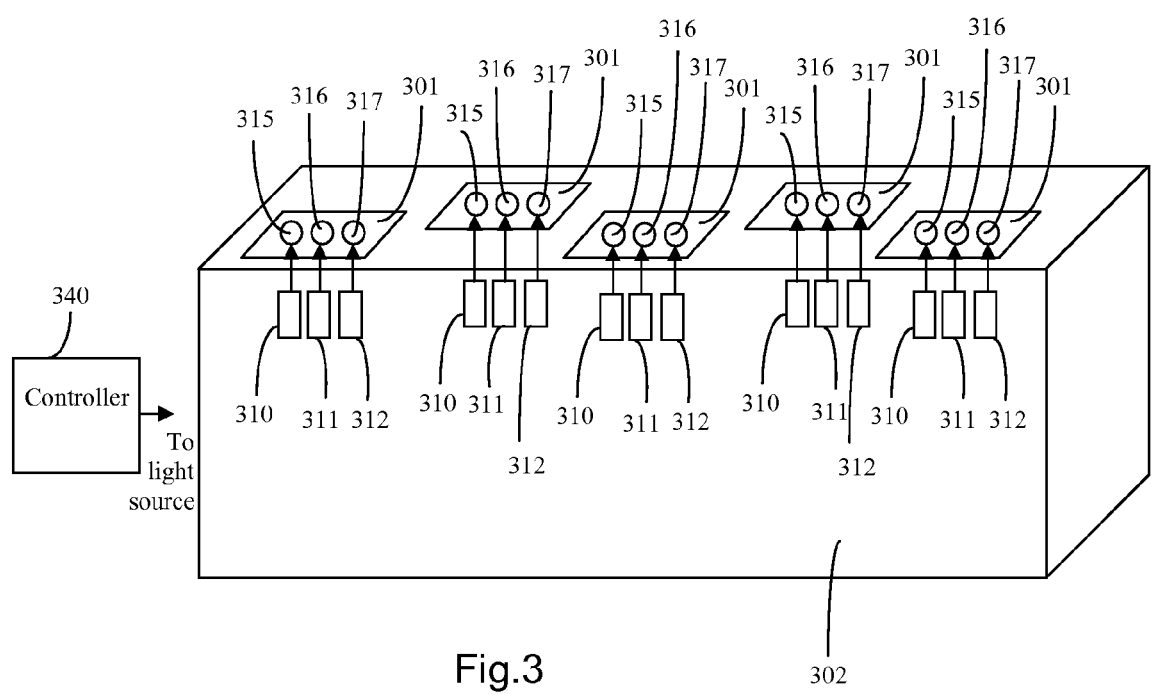
FIG. 3 shows an exemplary 2D pixelated display according to an embodiment of the present invention comprising a plurality of semiconductor surface emitters comprising either VCSELs or resonant cavity light emitting diodes (RCLEDs) formed on a semiconductor substrate. Each pixel of the display includes separate regions having red, green and blue upconverting material therein, the red, green and blue material each having their own excitation light sources.

FIG. 3 shows an exemplary 2D integrated pixelated display 300 comprising a plurality of pixels 301 formed on substrate 302. Pixels 301 have respective upconverting regions of red emitting (e.g. 315), green emitting (e.g. 316) and blue emitting (e.g. 317), wherein each region is optically coupled to a light source 310-312. Light sources 310-312 are top emitting devices, such as RCLEDs or VCELS. Arrows show the direction of light emitted by the light sources which is toward its associated upconverting material. In the embodiment shown, one light source/upconverting combination provides red light (e.g. light source 310 and region 315), one combination provides green light (e.g. light source 311 and region 316), and one combination provides blue light (e.g. light source 312 and region 317). The respective light sources associated with each pixel are preferably individually addressable and controllable. Display 300 includes a controller 340 for selectively controlling emission from the plurality of light sources for each of the plurality of pixels. Although not shown in FIG. 3, the respective light sources can include associated modulators, which can be coupled to controller 340. Although shown as a discrete module, controller can be formed on common substrate 302.

The present invention can be used to form 3D displays. In one embodiment, 3D displays can be implemented using two microdisplays according to the present invention, such as spaced apart microdisplays within a headset. One microdisplay is for each eye so that stereovision is provided by the headset display (e.g. See FIG. 4).

As known in the art, the pixel emission can be controlled by addressing the semiconductor light source with its own electrodes, or with an array of electrodes to form matrix addressing. The matrix addressing can be active or passive. For example, using two-dimensional active matrix addressing, a row of semiconductor light emitters may be simultaneously gated by applying a given voltage, while additional voltage is applied to column electrodes. The column electrode voltages may contain display data in their specific voltage values, and this data can be transferred to the semiconductor light emitter, which in turn excites the upconverting material. By choosing an electro-optical response of the semiconductor light source that is faster than the optical response of the upconverting material, visible luminescence can be maintained in the upconverting material after the semiconductor light source is turned off. In this manner display data can be individually sent to a large number of pixels using a much smaller number of electrodes. Passive matrix addressing can also be achieved using similar optical responses between the semiconductor light source and upconverting materials.

In one embodiment, the active matrix display arrangement disclosed in U.S. Pat. No. 6,215,462 to Yamada et al. is used. '462 discloses a matrix display device having a plurality of rows of pixels. The rows of the matrix display are selected one by one. Each row is associated with a light waveguide which transports light generated by a first light emission element to the pixels of the row. A particular row is selected if the associated select light emission element produces light; all the other rows are not selected because their associated select light emission elements do not produce light. Each pixel comprises a series arrangement of a light sensitive element and a pixel light emission element. A data voltage in accordance with the image data to be displayed is supplied to the series arrangement via column conductors. In the selected row of pixels, the light generated by the select light emission element associated with the selected row reaches the pixels of the selected row via the associated light waveguide. Consequently, the light sensitive elements of the pixels of the selected row have a low impedance, and the data voltage occurs substantially over the pixel light emission elements of the pixels of the selected row. Thus, the selected row of pixels will generate an amount of light in accordance with the image data presented on the column conductors which each are connected to a column of pixels. In the rows which are not selected, the select light emission elements do not produce light, and thus the impedance of the light sensitive elements of not selected pixels is high. For these pixels, the data voltage will substantially occur across the high impedance of the light sensitive elements, and consequently, the voltage across the pixel light emission elements will be below a threshold value such that the pixel light emission elements will not produce light.

Since the invention involves devices manufactured on a semiconductor or other substrate the size of a high resolution display involving many emitters can be as small as or smaller than a millimeter on a side. Pixels may range in size from tens of nanometers to hundreds of microns, or larger. In some applications desirable pixel sizes range from 1 μm per side to 50 μm per side, since these sizes are readily achieved using available semiconductor and thin film fabrication methods. Pixels of 5 μm size per side can provide high resolution display images even for total display sizes of less than 1 cm per side. As noted above, such arrays can be produced by standard semiconductor chip fabrication processes including thin film deposition, uv lithography, advanced lithographic techniques and various etch and thin film removal processes. The size of these emitters can be as small as or smaller than the wavelength of either the infrared or visible light used in the devices leading to very high resolution displays.

For the smallest size, the semiconductor light source can comprise of one or more quantum dots that can be tens of nanometers in their largest dimensions. For very small semiconductor sources microcavities can be used to efficiently transfer the light emitted from the semiconductor to the upconverting materials. These microcavities can confine light of either the semiconductor or the upconverting particles to the dimensions of the wavelength of the light in the material. Moreover, plasmonic confinement due to a complex refractive index material can be incorporated to confine light of either the semiconductor or upconverting materials to dimensions less than the light's wavelength in bulk materials. In making such very small devices microcavity techniques will play an important role. If microcavities are used, shorter fluorescent lifetimes and higher efficiencies can be expected. The shorter fluorescent lifetime and higher efficiency are due to the optical feedback provided by the cavity, with this optical feedback modifying the radiation resistance of the fluorescing materials local environment.

Surface emitting based devices according to the invention are useful for displays, as well as single color or combined color sources, including flashlights, solid state lighting, and various single color displays. Edge emitting based devices according to the invention are not readily individually addressed for fill color displays, but can provide lower manufacturing costs for flashlights, solid state lighting, single color displays.

Displays according to the invention generally provide very high resolution, wider color gamut, are low cost, compact, lightweight, efficient displays and solid state light sources. Applications include head mounted displays, 3D stereoscopic displays, cell phone displays, PDA displays, computer and TV displays with high resolution and exceptional brightness.

Arrays according to the invention can also be configured to provide a common focus of the respective light sources to produce a more intense output beam. Such embodiments allow formation of spotlights and other devices requiring high intensity.

Figure 4:
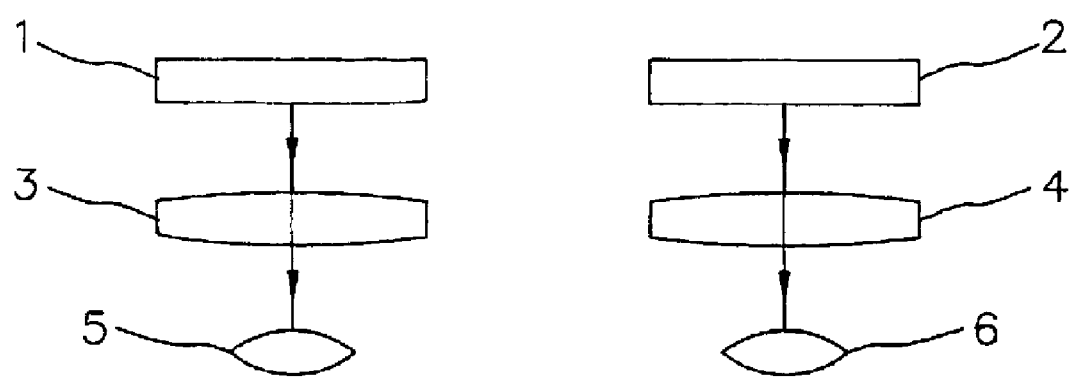
FIG. 4 shows a simplified schematic of an exemplary head-mounted display (HMD) apparatus comprising a pair of image display devices according to the invention.

As known in the art, a head-mounted display (HMD) is a display device worn on the head or as part of a helmet, that has a small display optic in front of each eye. A typical HMD has either one or two small displays with lenses and semi-transparent mirrors embedded in a helmet, eye-glasses or visor. The display units are generally based on CRT, LCDs, Liquid Crystal on Silicon (LCos), or OLED. FIG. 4 shows a simplified schematic of an exemplary head-mounted display (HMD) apparatus 400 comprising a pair of image display devices 401 and 402 according to the invention, and a pair of magnifying lenses 403 and 404. The image display devices 401 and 402 are disposed in front of left and right eyes 405 and 406 of an observer, respectively, and are connected to a video signal source (not shown) to display images on the basis of video signals therefrom. The magnifying lenses 403 and 404 are positioned between the image display devices 401 and 402 and the left and the right eyes 405 and 406, respectively, thereby enabling the observer to see enlarged virtual images formed at a certain distance from the eyes 405 and 406. Although shown with two displays in FIG. 4, as known in the art, the HMD can utilize a single display, such as by disposing a beam splitter between a single image display device and one of the eyes to split the light from the image display device into two light beams.

EXAMPLES

It should be understood that the Example described below are provided for illustrative purposes only and do not in any way define the scope of the invention.

The invention was evaluated by forming integrated light emitting semiconductor devices according to the invention by placing a plurality of small upconverting particles with sizes ranging from less than 1 µm to about 50 µm on a plurality of semiconductor light sources formed on a common substrate. The light sources were GaAs VCSELs emitting in the wavelength range of 975 nm. The VCSEL was biased at ~3 mA to produce tens of microwatt output. High intensity red, green and blue light was generated on separate pixels using the separate surface emitting semiconductor light sources.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

We claim:

1. An integrated light emitting device, comprising:
   a substrate;
   at least one semiconductor light emitting device comprising an active region formed in or on said substrate, and
   upconverting material disposed in or on said substrate outside said active region and outside any laser cavity, wherein said upconverting material is disposed in a path of light processed by said device or emitted by said active region, said upconverting material absorbing light emitted by said active region and spontaneously emitting upconverted light in response;
   wherein said at least one light emitting semiconductor device comprises a first, second and third semiconductor light emitting device formed in or on said substrate and said integrated light emitting device comprises at least one pixel operable for emitting red light, green light and blue light, said pixel comprising red light emitting upconverting material optically coupled to said first semiconductor light emitting device, green light emitting upconverting material optically coupled to said second semiconductor light emitting device, and blue light emitting upconverting material optically coupled to said third semiconductor light emitting device.

2. The device of claim 1, wherein said red light emitting, green light emitting and blue light emitting upconverting materials each comprise doped fluoride crystals.

3. The device of claim 1, wherein said red light emitting, green light emitting and blue light emitting upconverting materials are disposed on an emitting surface of said first, second and third semiconductor light emitting devices, respectively.

4. The device of claim 1, wherein said first, second and third semiconductor light emitting devices are surface emitting devices.

5. The device of claim 4, wherein said surface emitting devices comprise a VCSEL or a RCLED.

6. The device of claim 1, wherein said first, second and third semiconductor light emitting devices each comprise a laser.

7. The device of claim 1, wherein said first, second and third semiconductor light emitting devices each comprise edge emitting devices.

8. The device of claim 1, wherein said red light emitting, green light emitting and blue light emitting upconverting materials comprise a plurality of particles having an average size from 0.1 microns to 100 microns.

9. The device of claim 2, wherein said doped fluoride crystals comprise $NaYF_4$, co-doped with $Tm^{3+}$ ions for providing said blue light, co-doped with $Ho^{3+}$ or $Er^{3+}$ ions for providing said green light and co-doped with $Er^{3+}$ for providing said red light.

10. The device of claim 1, wherein said substrate is a semiconductor substrate, said semiconductor substrate comprising silicon or GaAs.

11. An integrated pixelated display, comprising:
    a substrate;
    a plurality of pixels formed on a surface of said substrate, said pixels each comprising:
    a red light source comprising at least one first semiconductor light emitting device comprising a first active region formed using said substrate, and red light emitting upconverting material disposed in or on said substrate outside said first active region and outside any laser cavity, wherein said red light emitting upconverting material is in a path of light processed or emitted by said first semiconductor light emitting device, said red light emitting upconverting material absorbing light from said first semiconductor device and spontaneously emitting red light in response;

a blue light source comprising at least one second semiconductor light emitting device comprising a second active region formed using said substrate, and blue light emitting upconverting material disposed in or on said substrate outside said second active region and outside any laser cavity, wherein said blue light emitting upconverting material is in a path of light processed or emitted by said second semiconductor light emitting device, said blue light emitting upconverting material absorbing light from said second semiconductor device and spontaneously emitting blue light in response;

a green light source comprising at least one third semiconductor light emitting device comprising a third active region formed using said substrate outside said third active region and outside any laser cavity, and green light emitting upconverting material disposed in or on said substrate, wherein said green light emitting upconverting material is in a path of light processed or emitted by said third semiconductor light emitting device, said green light emitting upconverting material absorbing light from said third semiconductor device and spontaneously emitting green light in response, and structure for selectively controlling emission of said red light source, said blue light source and said green light source for each of said plurality of pixels.

12. The display of claim 11, wherein said first, second and third semiconductor light emitting devices comprise VCSELs or RCLEDs.

13. The display of claim 11, wherein said first, second and third semiconductor light emitting devices emit different wavelengths.

14. The display of claim 11, wherein said substrate comprises silicon or GaAs.

15. A head mounted display (HMD) apparatus, comprising:

at least one integrated pixelated display, comprising:

a plurality of pixels formed on a surface of said substrate, said pixels each comprising:

a red light source comprising at least one first semiconductor light emitting device comprising a first active region formed using said substrate, and red light emitting upconverting material disposed in or on said substrate outside said first active region and outside any laser cavity, wherein said red light emitting upconverting material is in a path of light processed or emitted by said first semiconductor light emitting device, said red light emitting upconverting material absorbing light from said first semiconductor device and spontaneously emitting red light in response;

a blue light source comprising at least one second semiconductor light emitting device comprising a second active region formed using said substrate, and blue light emitting upconverting material disposed in or on said substrate outside said second active region and outside any laser cavity, wherein said blue light emitting upconverting material is in a path of light processed or emitted by said second semiconductor light emitting device, said blue light emitting upconverting material absorbing light from said second semiconductor device and spontaneously emitting blue light in response;

a green light source comprising at least one third semiconductor light emitting device comprising a third active region formed using said substrate, and green light emitting upconverting material disposed in or on said substrate outside said third active region and outside any laser cavity, wherein said green light emitting upconverting material is in a path of light processed or emitted by said third semiconductor light emitting device, said green light emitting upconverting material absorbing light from said third semiconductor device and spontaneously emitting green light in response, and structure for selectively controlling emission of said red light source, said blue light source and said green light sources for each of said plurality of pixels, and a first and a second magnifying lens optically aligned to receive light emitted from said plurality of pixels.

16. The HMD of claim 15, wherein said at least one integrated pixelated display comprises a first and a second integrated pixelated display, said first and a second integrated pixelated display optically coupled to said first and said second magnifying lens, respectively.

* * * * *